United States Patent
Hung et al.

(10) Patent No.: US 7,518,536 B2
(45) Date of Patent: Apr. 14, 2009

(54) METHOD AND APPARATUS FOR DEBINARIZATION OF DIGITAL VIDEO DATA DURING DECODING

(75) Inventors: Chun Kit Hung, Kowloon (HK); Kin Wing Au, Hsin-Chu (HK); Bojun Meng, New Territories (HK)

(73) Assignee: Hong Kong Applied Science and Technology Research Institute Co. Ltd., Shatin, New Territories (HK)

( * ) Notice: Subject to any disclaimer, the term of this patent is extended or adjusted under 35 U.S.C. 154(b) by 0 days.

(21) Appl. No.: 11/694,451

(22) Filed: Mar. 30, 2007

(65) Prior Publication Data

US 2008/0238731 A1   Oct. 2, 2008

(51) Int. Cl.
*H03M 7/30* (2006.01)
(52) U.S. Cl. .................. 341/107; 341/51; 375/240.25; 382/247
(58) Field of Classification Search .................. 341/51, 341/107; 375/240.23, 240.25, 240.26; 382/233, 382/237, 240, 246, 247
See application file for complete search history.

(56) References Cited

U.S. PATENT DOCUMENTS

| | | | |
|---|---|---|---|
| 4,494,108 A * | 1/1985 | Langdon et al. ............... 341/51 | |
| 6,812,873 B1 | 11/2004 | Siohan et al. | |
| 6,856,701 B2 | 2/2005 | Karczewicz et al. ........ 382/247 | |
| 6,900,748 B2 | 5/2005 | Marpe et al. ................. 341/107 | |
| 6,927,710 B2 | 8/2005 | Linzer et al. ................. 341/107 | |
| 7,365,660 B2 * | 4/2008 | Park et al. .................... 341/107 | |
| 2006/0123029 A1 | 6/2006 | LeTourneau | |
| 2007/0040708 A1 | 2/2007 | Senda | |

OTHER PUBLICATIONS

Krivoulets; On redundancy of coding using binary tree decomposition; Proceedings of the 2002 IEEE: Information Theory Workshop, 2002; Publication Date: Oct. 20-25, 2002 p. 200.*

Marpe, D.; Context-based adaptive binary arithmetic coding in the H.264/AVC video compression standard; IEEE Transactions on Circuits and Systems for Video Technology, Jul. 2003 vol. 13, Issue: 7 pp. 620-636.*

* cited by examiner

*Primary Examiner*—Howard Williams
(74) *Attorney, Agent, or Firm*—Fish & Richardson P.C.

(57) ABSTRACT

A debinarizer and a hardware-based method for debinarizing a binary bit stream into symbols comprising predefined binary sequences are disclosed in which predefined binary sequences and their corresponding symbols are represented as tree structures. A binary sequence is debinarized by traversing one of the tree structures to determine a corresponding symbol. Similar tree structures may be combined to form a single tree structure. The tree structures may be implemented as a finite state machine.

10 Claims, 6 Drawing Sheets

METHOD AND APPARATUS FOR DEBINARIZATION OF DIGITAL VIDEO DATA DURING DECODING

FIELD OF THE INVENTION

The present invention relates generally to decoding or decompression of digital video signals and more particularly to debinarization during decoding of a Context-based Adaptive Binary Arithmetic Coded (CABAC) digital video signal.

BACKGROUND

Digital video data is typically compressed to reduce storage capacity and/or transmission bandwidth requirements. The ITU-T H.264 standard for compression/decompression of digital video signals supports Context-based Adaptive Binary Arithmetic Coding (CABAC), which is an efficient form of entropy coding that continuously adapts to the statistical properties of the data being coded. For example, CABAC coding/decoding requires only about 50% of the bit rate required by MPEG-2 coding/decoding to achieve the same general quality of video reproduction. Although relatively more efficient than the Huffman coding/decoding used in MPEG-2 coding/decoding, CABAC coding/decoding generally comprises a sequential multi-step process that is relatively more computationally intensive. As a consequence, parallel hardware architectures generally have limited utility in improving throughput in CABAC coding/decoding.

Data symbols in digital video signals are binarized, or converted into binary values, during CABAC coding. Accordingly, CABAC decoding requires conversion of the binary values back into symbols. This process is known as debinarization.

U.S. Pat. No. 6,900,748, entitled "Method and apparatus for binarization and arithmetic coding of a data value", issued to Marpe et al. on May 31, 2005 and has been assigned to Fraunhofer-Gesellschaft zur Foerderung Der Angewandten Forschung e.V. According to this document, results from an arithmetic decoder are buffered and a debinarized value is calculated based on the result of a comparison between a codeword value and a cut-off value.

U.S. Pat. No. 6,856,701, entitled "Method and system for context-based adaptive binary arithmetic coding", issued to Karczewicz et al. on Feb. 15, 2005 and has been assigned to Nokia Corporation. This document relates to an overall system level architecture for implementation of a CABAC algorithm.

U.S. Pat. No. 6,927,710, entitled "Context based adaptive binary arithmetic CODEC architecture for high quality video compression and decompression", issued to Linzer et al. on Aug. 9, 2005 and has been assigned to LSI Logic Corporation. This document relates to an overall system level architecture for implementation of a CABAC algorithm.

The debinarization process is computationally intensive and has to be performed within time constraints imposed by real time video. Thus, a need exists for improved methods and apparatuses for performing debinarization that are relatively less computationally intensive and/or require relatively less data storage than existing arrangements.

SUMMARY

Aspects of the present invention provide a method, an apparatus and a computer program product for performing debinarization during decoding of a Context-based Adaptive Binary Arithmetic Coded (CABAC) digital video signal.

One aspect of the present invention provides a hardware-based method for debinarizing a binary bit stream into symbols comprising predefined binary sequences. The method comprises the steps of representing the predefined binary sequences and their corresponding symbols as tree structures and debinarizing a binary sequence by traversing one of the tree structures to determine a corresponding symbol.

The binary bit stream may comprise a Context-based Adaptive Binary Arithmetic Coded (CABAC) video stream. Each tree structure may correspond to a different syntax element. Similar tree structures may be combined to form a single tree structure. The tree structures may be implemented as a finite state machine. A tree structure may be implemented by repeating a simple state machine structure.

Another aspect of the present invention provides a debinarizer for decoding Context-based Adaptive Binary Arithmetic Coded (CABAC) signals. The debinarizer comprises at least one control element and a plurality of tree structures that are representative of predefined binary sequences and their corresponding symbols. The debinarizer is adapted to traverse a tree structure to determine a symbol corresponding to a predefined binary sequence.

The debinarizer may comprise a finite state machine. The at least one control element may comprise an input controller, an output controller, and a debinarizer-arithmetic decoder controller.

BRIEF DESCRIPTION OF THE DRAWINGS

Embodiments are described hereinafter, by way of example only, with reference to the accompanying drawings in which.

DETAILED DESCRIPTION

Embodiments of the present invention described hereinafter relate to a method, an apparatus and a computer program product for performing debinarization during decoding of a Context-based Adaptive Binary Arithmetic Coded (CABAC) digital video signal. Debinarization comprises conversion of binary sequences in a bit stream into symbols.

Each frame of a digital video stream is generally divided into "slices" for processing or decoding by a CABAC decoder. The three main components used for debinarization in a CABAC controller module are a Debinarizer, an Arithmetic Decoder and Context Modeler, as described hereinafter. Each slice of a frame comprises a number of syntax elements, from which symbols are debinarized based on iterative computational processes occurring between the Debinarizer, the Arithmetic Decoder, and the Context Modeler. Decoding of a slice generally involves initialization of the Context Modeler and decoding of several syntax elements in that slice. There are two main categories of syntax elements in the H.264 standard. The first category relates to the macroblock type, the sub-macroblock type, the prediction modes and the slice, whereas the second category relates to the residual data and transform coefficients. A coded symbol for the Arithmetic Decoder comprises a binary '0' or '1', whereas a syntax element comprises a sequence of coded symbols.

Embodiments of the present invention use tree structures to represent the binary (bit) sequences that are representative of symbols. A tree structure is a hierarchical data structure that typically comprises a single root node, intermediate nodes and leaf nodes. The tree structures of embodiments of the present invention are defined in hardware (e.g., as a finite state machine) to speed up debinarization or decoding and reduce the load on higher level control logic.

Figure 1:
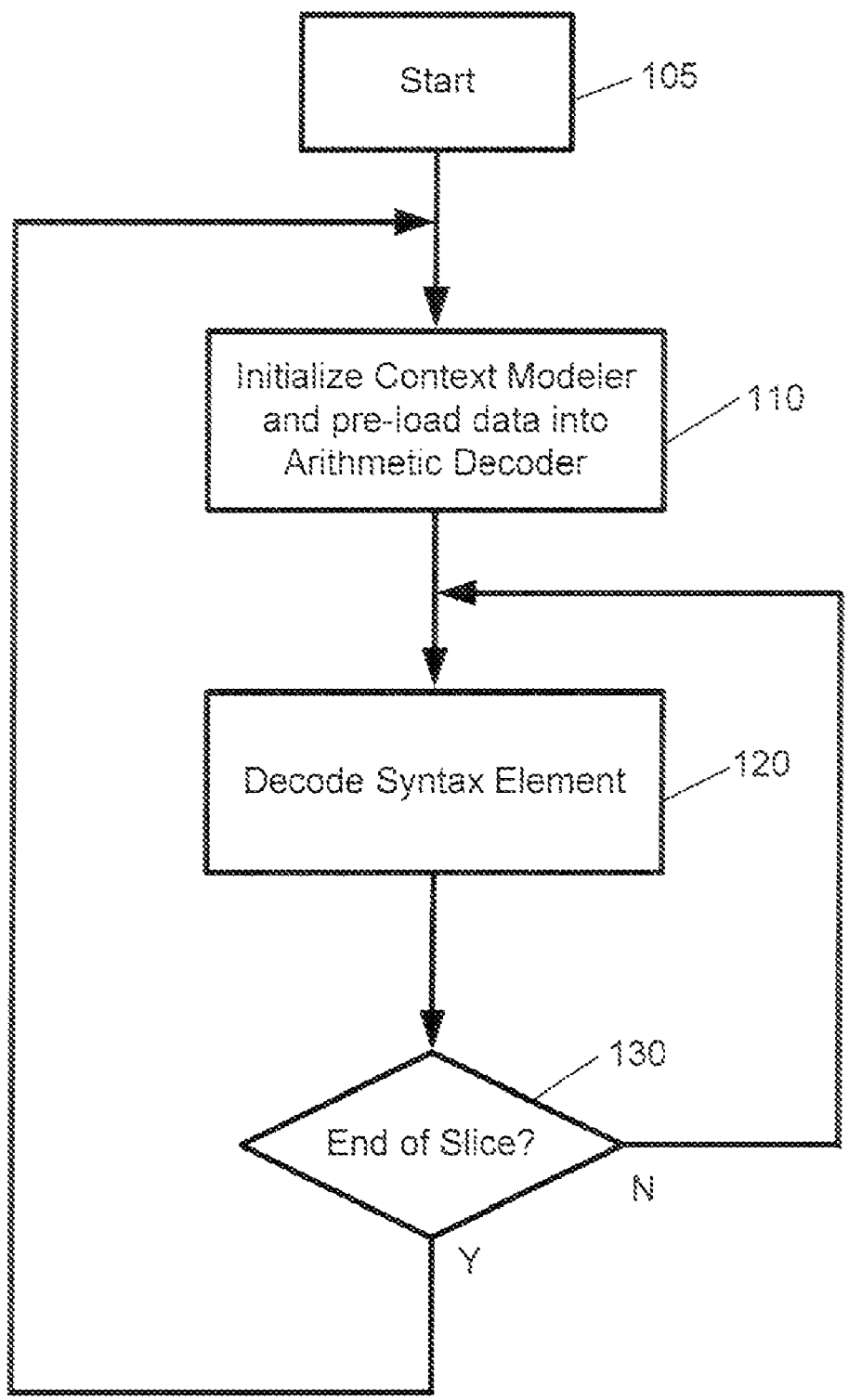
FIG. 1 is a flow diagram of a CABAC decoding method in accordance with an embodiment of the present invention.

FIG. 1 is a flow diagram of a CABAC decoding method in accordance with an embodiment of the present invention. Referring to FIG. 1, processing begins at step 105, which may comprise a system reset. At step 110, the Context Modeler is initialized and data relating to the current slice is pre-loaded into the Arithmetic Decoder. Thereafter, syntax elements of the current slice are decoded at step 120. At step 130, a determination is made whether all the syntax elements of the current slice have been decoded. If not (N), the next syntax element is decoded at step 120. On the other hand, if all the syntax elements of the current slice have been decoded (Y) at step 130, the next slice is selected and initialized at step 110.

Decoding of the syntax elements (step 120) is performed by the Debinarizer, Arithmetic Decoder, and Context Modeler hierarchical control logic. To simplify the control logic, steps 110 and 130 of FIG. 1 may be performed by a separate finite state machine or embedded processor.

Figure 2:
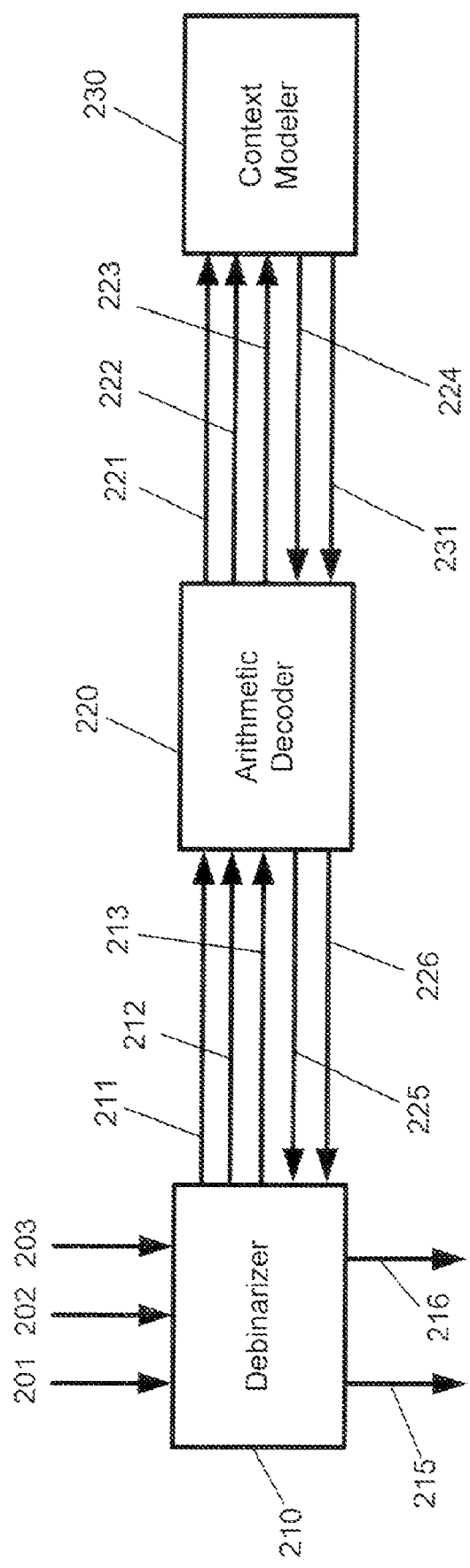
FIG. 2 is a hardware interface block diagram of the main components used for debinarization during CABAC decoding in accordance with an embodiment of the present invention.

FIG. 2 is a hardware interface block diagram of the main components used for debinarization during CABAC decoding in accordance with an embodiment of the present invention. The main components comprise a Debinarizer 210, an Arithmetic Decoder 220 and Context Modeler 230. On account of performing computationally intensive functions, hardware implementation of these main components is desirable for reasons of speeding-up the decoding process. The Arithmetic Decoder 220 comprises a hardware implementation of arithmetic and/or operational functions such as addition, multiplication and/or copying (e.g., as a table look-up and/or bit-shifting operation). The Context Modeler 230 is typically implemented as memory (Context Model Memory) and one or more arithmetic operation/s such as addition, multiplication and/or bit/shifting. The Debinarizer 210, Arithmetic Decoder 220 and the Context Modeler may be implemented as finite state machines. Debinarization operation of the CABAC decoder, with reference to the Debinarizer 210, Arithmetic Decoder 220, Context Modeler 230 and related signals of FIG. 2 is described hereinafter.

When data relating to the current slice is ready for debinarization, the top level controller (not shown in FIG. 2) passes an initialization parameter to the Context Modeler 230 (not shown in FIG. 2) and requests the Arithmetic Decoder 220 to shift the initial value from an input buffer (not shown in FIG. 2).

The Debinarizer 210 receives a tree enable (TreeEn) signal 201 generated by the top level controller (not shown in FIG. 2) and latches the context model identification (CM_ID) data 202 and the tree identification (tree_ID) signal 203 in response to the tree enable (TreeEn) signal 201. The Debinarizer 210 uses the tree identification (tree_ID) signal 203 to select a tree structure and passes the context model identification (CM_ID) data 202 to the selected tree structure.

The Debinarizer 210 sends an arithmetic decoder enable (ADEn) signal 211 to the Arithmetic Decoder 220. On receipt of the ADEn signal 211, the Arithmetic Decoder 220 latches the arithmetic decoder number (ADNum) signal 212 and the content memory address (CMAdd) signal 213. The (ADNum) signal 212 informs the Arithmetic Decoder 220 which arithmetic sub-decoder (EAD, FAD or AD) to use for decoding of the current syntax element. The EAD sub-decoder decodes the current syntax element based on equal probability of the two predicted output symbols, the FAD sub-decoder is used for decoding the final bit of a slice segment, and the AD sub-decoder uses the context model as input to obtain the estimated probability for the two output symbols. The (CMAdd) signal 213 informs the Arithmetic Decoder 220 of the address (e.g., a particular context model base address and offset) of the context memory location to use. The (CMAdd) signal 213 and the (ADNum) signal 212 are generated by the Debinarizer 210 based on the current node status. The debinarizer 210 comprises a number of tree structures, each of which comprises a number of nodes. Each node comprises the current node information or current node status. The current node status includes the context model offset, the next node to be branched to, and the branching condition.

The Arithmetic Decoder 220 issues a content memory read enable (CM_ren) signal 221 to the Context Modeler 230 and retrieves data (CMDataOut 231) stored in the memory location specified by the CMAdd signal 223. The CMAdd signal 223 specifies a memory location in the Context Modeler 230 and corresponds to the CMAdd signal 213.

The Arithmetic Decoder 220 calculates the decoded bits based on the statistical information (e.g., the frequency of the occurrence of the symbol '0' or the symbol '1') and the data retrieved from the memory location in the Context Modeler 230 that was specified by the CMAdd signal 213. The Arithmetic Decoder 220 also updates the data in the location specified by the CMAdd signal 213.

The Arithmetic Decoder 220 indicates to the Debinarizer 210 that a decoded bit (DecodedBit) 226 is available and sends the decoded bit value (DecodedBitVal) 225 to the Debinarizer 210. The Debinarizer 210 performs a branching operation for further traversing the current tree structure based on the DecodedBitVal 225.

The Debinarizer 210 signals (TreeOutDataValid) 215 the availability of tree output data (TreeOutData) 216 to the top level controller (not shown in FIG. 2).

As may be seen from the method described hereinbefore with reference to FIG. 2, only initialization, passing of syntax element parameters, and end-of-slice processing is performed by the top level control. Once, decoding is initiated, the Debinarizer 210, Arithmetic Decoder 220 and Context Modeler 230 perform the decoding process and generate the necessary control signals in relation to one another. This advantageously provides a hierarchical control structure that reduces the administrative burden on the top level control. Accordingly, a processor of relatively less processing power may be used to perform the CABAC decoding process.

Figure 3:
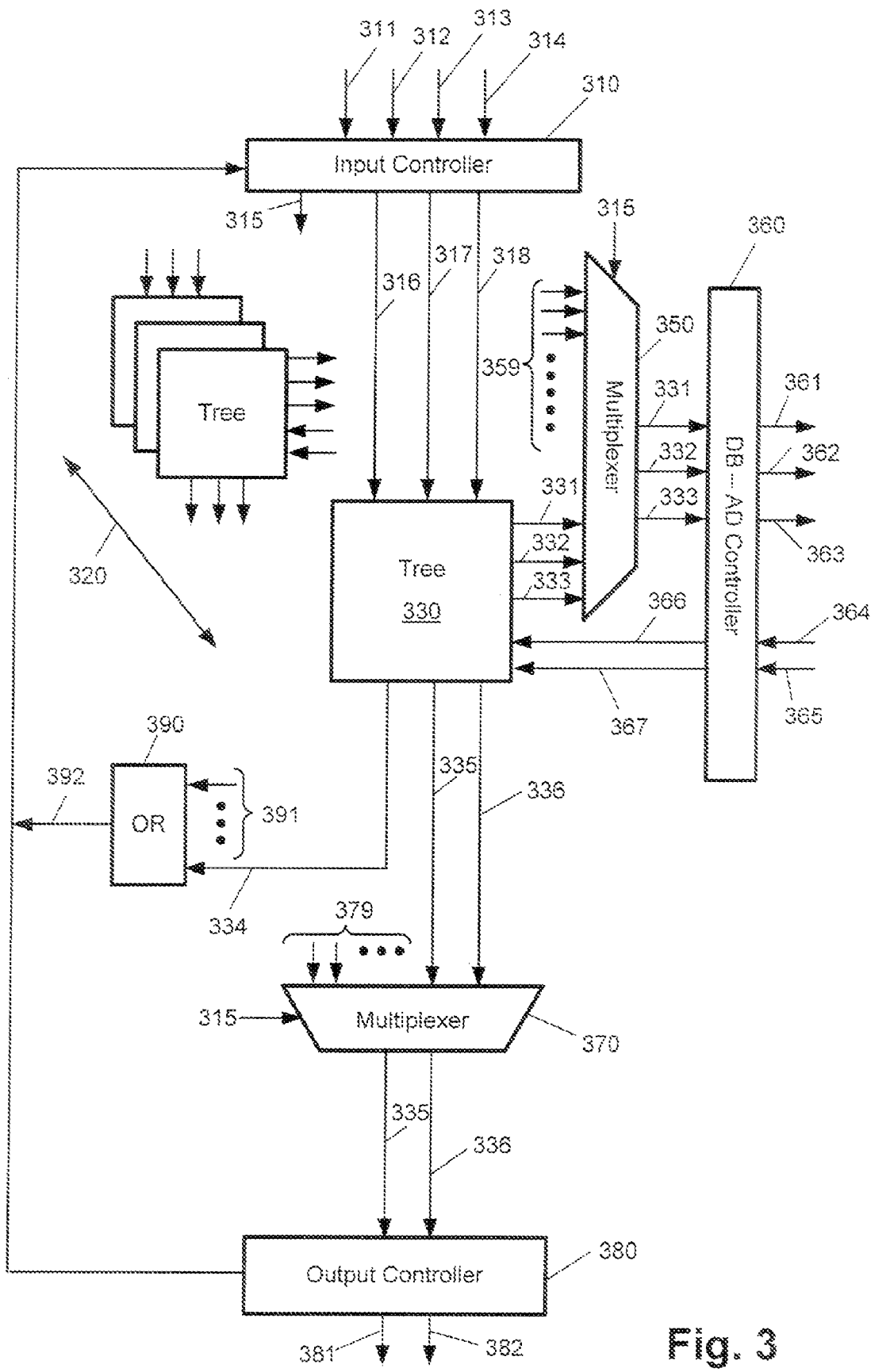
FIG. 3 is a block diagram of a debinarizer in accordance with an embodiment of the present invention.

FIG. 3 is a block diagram of a debinarizer in accordance with an embodiment of the present invention. For example, the debinarizer 300 of FIG. 3 may be used to practice the debinarizer 210 of FIG. 2.

Referring to FIG. 3, the debinarizer 300 comprises an input controller 310, a debinarizer-arithmetic decoder controller 360, an output controller 380 and multiple tree structures 320 . . . 330. The debinarizer 300 is shown with the tree structure 330 selected, however, other tree structures 320 may alternatively be selected by a higher level controller (not shown in FIG. 3). A particular tree structure is selected using the tree identification (Tree_ID) signal 311, which is input to the input controller 310 and corresponds to the tree identification (tree_ID) signal 203 of FIG. 2. Other inputs to the input controller 310 of the debinarizer 300 from the higher level controller include a tree enable (TreeEn) signal 312 (which corresponds to the tree enable (Tree_En) signal 201 of FIG. 2), and two context model identification (CM_ID$_i$ and CM_ID$_j$) signals 313 and 314 (which correspond to the context model identification (CM_ID) signal 202 of FIG. 2).

The input controller 310 outputs a tree enable (En) signal 316 and two context model identification (CM$_i$ and CM$_j$) signals 317 and 318, respectively, to select the tree structure 330.

An arithmetic decoder number (ADNum) signal 331, an arithmetic decoder enable (ADEn) signal 332, and a context memory address (CMAdd) signal 333 are provided to an arithmetic decoder (external to the debinarizer 300 and not shown in FIG. 3) via a multiplexer 350 and a debinarizer-arithmetic decoder (DB-AD) controller 360. The arithmetic decoder number (ADNum) signal 331, the arithmetic decoder enable (ADEn) signal 332, and the context memory address (CMAdd) signal 333 correspond to signals 212, 211 and 213 of FIG. 2, respectively. The multiplexer 350 enables the arithmetic decoder number (ADNum) signal 331, the arithmetic decoder enable (ADEn) signal 332, and the context memory address (CMAdd) signal 333 to be transferred from the selected tree structure 330 to the debinarizer-arithmetic decoder (DB-AD) controller 360 and is controlled by an encoded enable (EncodedEn) signal 315 produced by the input controller 310. The arithmetic decoder number (ADNum), the arithmetic decoder enable (ADEn), and the context memory address (CMAdd) signals 359 may alternatively be supplied from another of the tree structures 320 via the multiplexer 350, in the event that another of the tree structures 320 is selected.

An arithmetic decoder number (ADNum) 361, an arithmetic decoder enable (ADEn) signal 362, and a context memory address (CMAdd) 363, which correspond to the arithmetic decoder number (ADNum) 331, the arithmetic decoder enable (ADEn) signal 332, and the context memory address (CMAdd) 333, are provided to the arithmetic decoder (external to the debinarizer 300 and not shown in FIG. 3) by the debinarizer-arithmetic decoder (DB-AD) controller 360.

The arithmetic decoder (external to the debinarizer 300) performs processing and interacts with a Context Modeler, as described hereinbefore with reference to FIG. 2. After processing is completed, the arithmetic decoder indicates to the debinarizer 300 that a decoded bit is available via the (DecodedBit) 365 signal. The decoded bit value (DecodedBitVal) 364 is provided to the debinarizer 300 via the debinarizer-arithmetic decoder (DB-AD) controller 360. The (DecodedBit) 365 signal and the decoded bit value (DecodedBitVal) 364 correspond to signals 226 and 225, respectively, of FIG. 2.

A debinarized tree output value (DB) 336 and an overflow (DBOverflow) 335 signal is supplied to the output controller 380 via a multiplexer 370. Debinarized tree output values (DB) and overflow (DBOverflow) signals 379 may alternatively be supplied from another of the tree structures 320 via the multiplexer 370, in the event that another of the tree structures 320 is selected. The multiplexer 370 is controlled by the encoded enable (EncodedEn) signal 315 produced by the input controller 310.

Each of the tree structures 320 . . . 330 provide a debinarized output valid signal (DBValid) after successful debinarization. As shown in FIG. 3 the selected tree structure 330 provides a debinarized output valid (DBValid) signal 334 after successful debinarization. The debinarized output valid signals (DBValid) from each of the tree structures 320 . . . 330 are combined in a logical OR function 390 to produce an overall debinarized output valid signal (ORDBValid) signal 392, which is used to control the input controller 310 and output controller 380 of the debinarizer 300.

The debinarized output value (DB) 382 and a debinarized output valid signal (DBValid) 381 are supplied to a higher level controller (not shown in FIG. 3) by the output controller 380 of the debinarizer 300.

Figure 4:
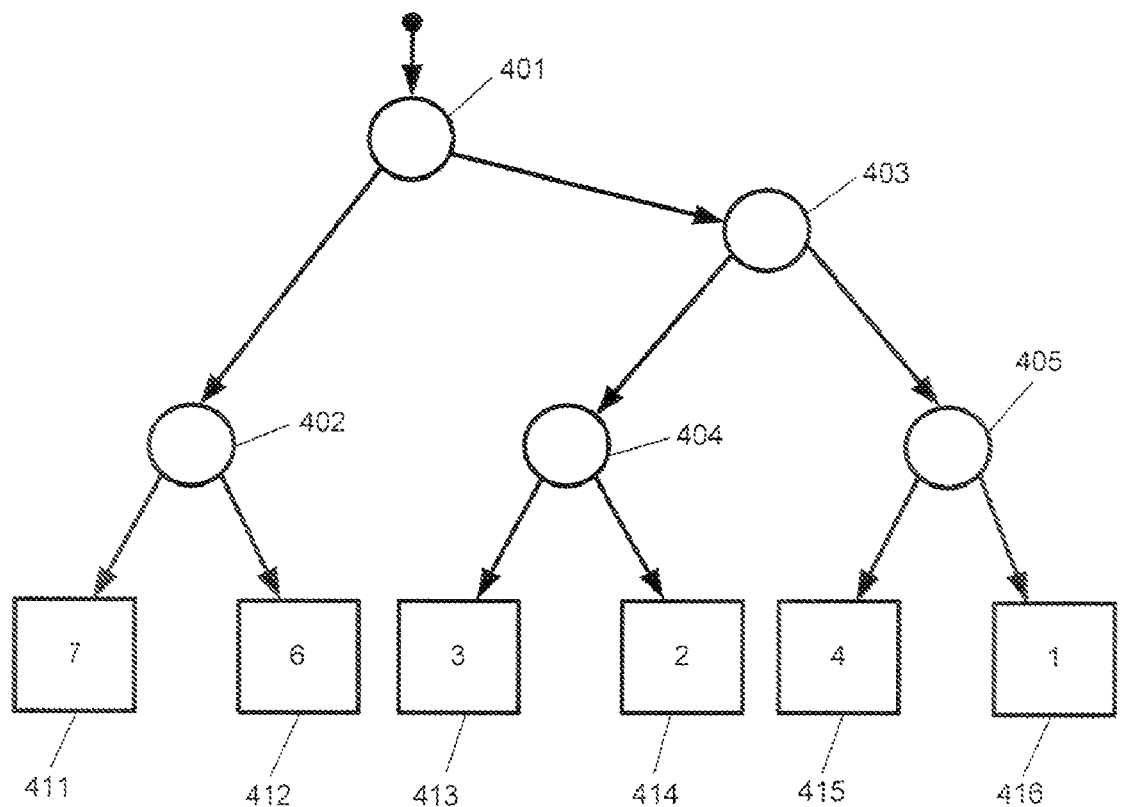
FIG. 4 is an example of a tree structure for performing debinarization during CABAC decoding in accordance with an embodiment of the present invention.

FIG. 4 shows an example of a tree structure for debinarizing or decoding binary (bit) sequences. Referring to the tree structure of FIG. 4, the circular nodes 401 to 405 represent intermediate tree nodes, whereas the square nodes 411 to 416 represent leaf nodes. Assuming the convention that a binary '1' represents branching to the left and a binary '0' represents branching to the right, debinarization results for each of the possible binary (bit) sequences (i.e., tree traversals) are shown in the Table 1 below:

TABLE 1

| Binary Sequence | Result |
|---|---|
| 000 | 1 |
| 001 | 4 |
| 010 | 2 |
| 011 | 3 |
| 10 | 6 |
| 11 | 7 |

For example, the binary sequence 000 traverses the tree via nodes 401, 403, 405 and 416 and the binary sequence 10 traverses the tree via nodes 401, 402 and 412.

In embodiments of the present invention, the Debinarizer comprises a number of tree structures for determining the different possible debinarized symbols or syntax elements. Each node in a tree structure may be treated as a node state and an Arithmetic Decoder state. The node states store certain parameters, such as:

a context model index offset, the next node, and a branching condition.

The arithmetic decoder state is used to decode the branching condition.

Figure 5:
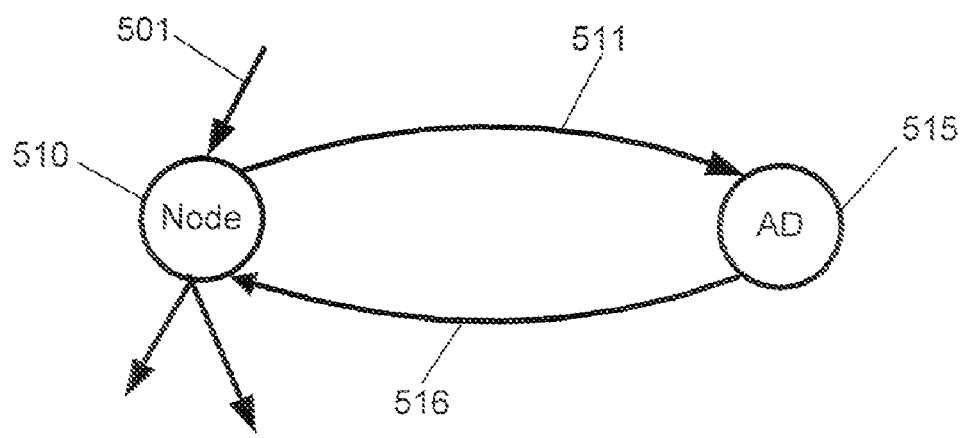
FIG. 5 is a tree structure diagram for describing debinarization in accordance with an embodiment of the present invention.

FIG. 5 is a tree structure diagram for describing debinarization in accordance with an embodiment of the present invention.

Referring to FIG. 5, a node in the tree structure is implemented as a node state 510 and an Arithmetic Decoder state 515. Input to the current node state 510 comprises a Context Memory index (CM) 501. The current node state 510 informs 511 the Arithmetic Decoder state 515 which Arithmetic sub-Decoder (AD, EAD or FAD) to use (ADNum) and a Context Model Memory Address (CMAdd). The Context Model Memory Address typically comprises a context model base address and an offset. The Arithmetic Decoder state 515 accesses the context memory to retrieve the statistical information based on the ADNum and CMAdd information and determine a branching condition. The branching condition (DecodedBit) is passed 516 to the node state 510 and thus, the debinarizer. Based on the branching condition (DecodedBit), the debinarizer causes the Node state path to branch left or right to the next node state in the tree structure, as the case may be. When a leaf node is reached, the debinarized value or symbol is returned to the top-level controller by the debinarizer. The top-level controller can then initiate decoding or debinarization of the next syntax element or symbol.

Figure 6:
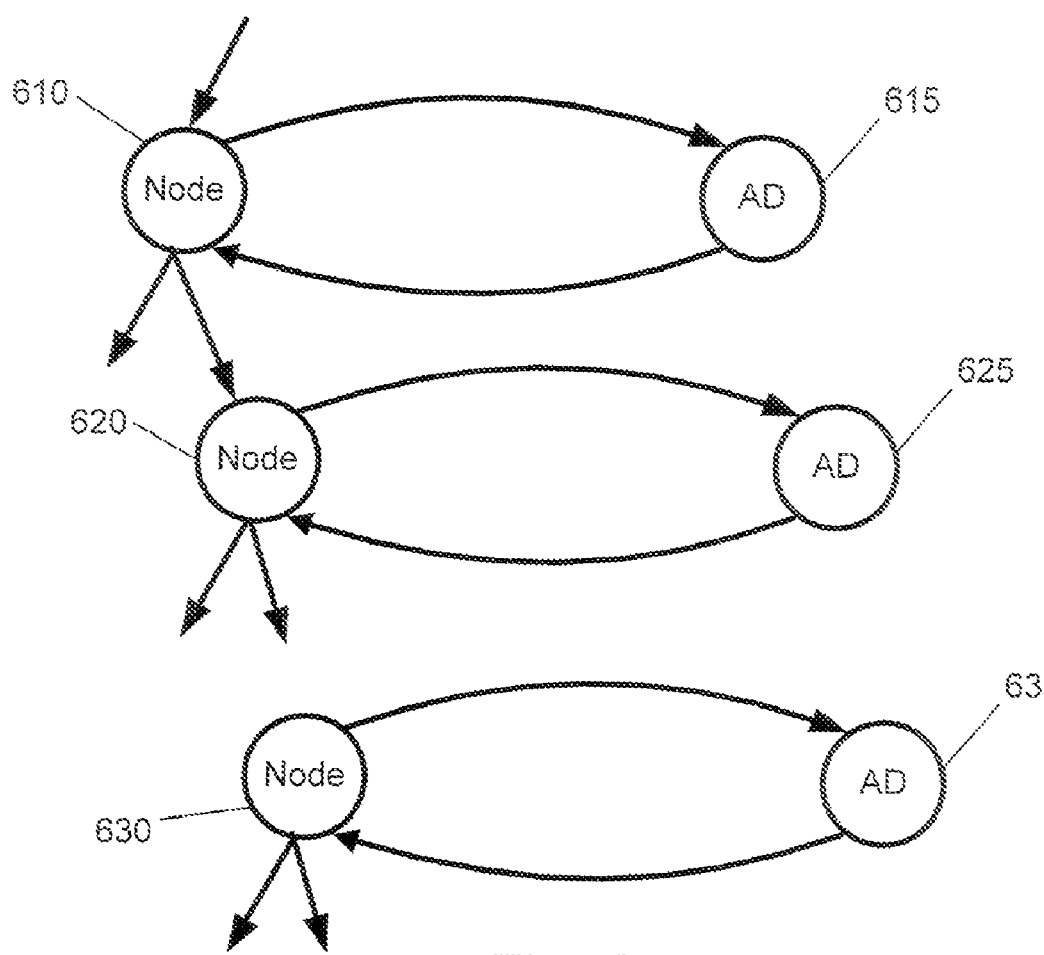
FIG. 6 is a tree structure diagram in accordance with another embodiment of the present invention.

FIG. 6 is a tree structure diagram that shows how a tree structure comprising nodes 610, 620 and 630 can be implemented by repeating the structure relating to a single node as shown in FIG. 5. Each of the node states 610, 620 and 630 has a corresponding Arithmetic Decoder state 615, 625 and 635, respectively.

Figure 7:
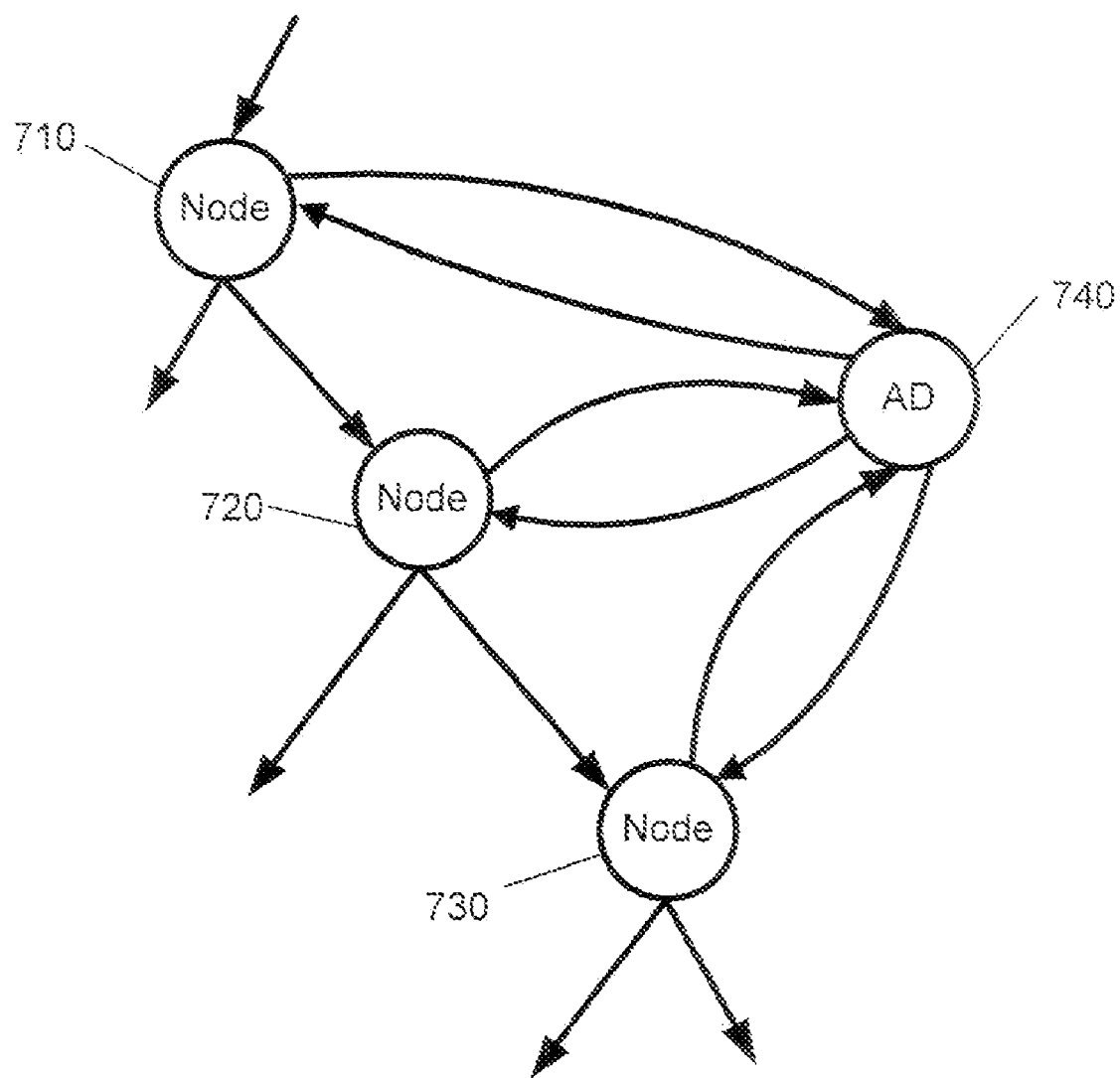
FIG. 7 is a tree structure diagram in accordance with another embodiment of the present invention.

FIG. 7 is a tree structure diagram that shows how a tree structure can alternatively be implemented by using the same Arithmetic Decoder state 740 for multiple nodes 710, 720 and 730. The Arithmetic Decoder state 740 of FIG. 7 is effectively equivalent to all three Arithmetic Decoder states 615, 625 and 635 of FIG. 6.

In one particular embodiment, the Debinarizer is capable of debinarizing 19 syntax elements that share a common tree structure. Similar tree structures may be combined into a single, common tree structure to reduce the hardware logic requirements. A particular tree structure (e.g., a common tree structure with a particular set of parameters) is selected using the TreeID signal (described hereinbefore with reference to FIG. 2).

Embodiments described hereinbefore advantageously enable simplification of a hardware implementation (e.g., a finite state machine) of a debinarizer for CABAC decoding. The embodiments described hereinbefore enable simplification of the system control logic and the integration process. Furthermore, complex tree structures are implemented by repetition of a simple state machine structure, and similar tree structures are combined into a single tree structure.

Embodiments described hereinbefore may be implemented using a low density, low cost, Xilinx Spartan 3e field programmable gate array (FPGA) chip.

The foregoing description provides exemplary embodiments only, and is not intended to limit the scope, applicability or configurations of the present invention. Rather, the description of the exemplary embodiments provides those skilled in the art with enabling descriptions for implementing an embodiment of the invention. Various changes may be made in the function and arrangement of elements without departing from the spirit and scope of the invention as set forth in the claims hereinafter.

Where specific features, elements and steps referred to herein have known equivalents in the art to which the invention relates, such known equivalents are deemed to be incorporated herein as if individually set forth. Furthermore, features, elements and steps referred to in respect of particular embodiments may optionally form part of any of the other embodiments unless stated to the contrary.

The term "comprising", as used herein, is intended to have an open-ended, non-exclusive meaning. For example, the term is intended to mean: "including principally, but not necessarily solely" and not to mean "consisting essentially of" or "consisting only of". Variations of the term "comprising", such as "comprise", "comprises" and "is comprised of", have corresponding meanings.

We claim:

1. A debinarizer for decoding Context-based Adaptive Binary Arithmetic Coded (CABAC) signals, said debinarizer comprising:
    at least one control element; and
    a plurality of tree structures that are representative of predefined binary sequences and their corresponding symbols;
    wherein each tree structure contains at least one node state and at least one arithmetic decoder state; and
    wherein said debinarizer traverses a tree structure to determine a symbol corresponding to a predefined binary sequence.

2. A debinarizer according to claim 1, wherein each of said tree structures correspond to a different syntax element.

3. A debinarizer according to claim 1, wherein similar tree structures are combined to form a single tree structure.

4. A debinarizer according to claim 1, wherein said debinarizer comprises a finite state machine.

5. A debinarizer according to claim 4, wherein at least one of said tree structures is implemented by repeating a simple state machine structure.

6. A debinarizer according to claim 1, wherein each node state contains:
    a context model index offset;
    a next node; and
    a branching condition.

7. A debinarizer according to claim 6, wherein said branching condition is decoded using the state of arithmetic decoder.

8. A debinarizer according to claim 1, wherein each node state is used in one or more tree structures.

9. A debinarizer according to claim 1, wherein two or more node states share one arithmetic decoder state.

10. A debinarizer for decoding Context-based Adaptive Binary Arithmetic Coded (CABAC) signals, said debinarizer comprising:
    at least one control element; and
    a plurality of tree structures that are representative of predefined binary sequences and their corresponding symbols;
    wherein said debinarizer is adapted to traverse a tree structure to determine a symbol corresponding to a predefined binary sequence,
    wherein said at least one control element includes an input controller, an output controller, and a debinarizer-arithmetic decoder controller.

* * * * *

UNITED STATES PATENT AND TRADEMARK OFFICE
CERTIFICATE OF CORRECTION

PATENT NO. : 7,518,536 B2  
APPLICATION NO. : 11/694451  
DATED : April 14, 2009  
INVENTOR(S) : Chun Kit Hung et al.

Page 1 of 1

It is certified that error appears in the above-identified patent and that said Letters Patent is hereby corrected as shown below:

On the title page item [75], Inventors: replace the Inventors section with the following amended version:

Inventors: should read as follows: Chun Kit Hung, Kowloon (HK); Kin Wing Au, ~~Hsin Chu~~ New Territories (HK); Bojun Meng, New Territories (HK)

Signed and Sealed this

Thirteenth Day of October, 2009

David J. Kappos  
*Director of the United States Patent and Trademark Office*